Oct. 24, 1967 P. A. JOHNSON 3,349,287

APPARATUS FOR FORMING MODULAR CIRCUITS

Filed Dec. 24, 1964

INVENTOR
Phillip A. Johnson
By [signature]
Attorney
John B. Miller, Jr.
Agent

United States Patent Office 3,349,287

Patented Oct. 24, 1967

3,349,287

APPARATUS FOR FORMING MODULAR CIRCUITS

Philip A. Johnson, Los Angeles, Calif., assignor to Litton Systems, Inc., Beverly Hills, Calif.

Filed Dec. 24, 1964, Ser. No. 420,945

1 Claim. (Cl. 317—101)

ABSTRACT OF THE DISCLOSURE

Electrical component packaging apparatus for holding electrical components in position with respect to one another during their incorporation into a modular circuit. Mutable holes are provided in the apparatus at each location where a component is to be located in the modular circuit and the components are passed through the mutable holes during the formation of the modulator circuit.

The present invention relates to an electrical component packaging apparatus and, more particularly, to an improved means for holding electrical components in position with respect to one another during their incorporation into a unitized module.

Unitized circuit construction consists of building electronic equipment in functional subassemblies which are mechanically and electrically capable of separate manufacture and test. Such subassemblies are readily replaceable within the operating equipment of which they are a part. This type of construction has been widely used in recent years because of the reductions in equipment size and weight and the concomitant improvements in equipment reliability. Unitization also facilitates mass production and first line maintenance.

One type of unitized circuit construction is a welded module circuit. In welded module electrical circuitry, high density component packaging is achieved by stacking components side by side in almost direct contact with one another in controlled figures. Components so positioned are appropriately connected to form the desired electrical circuits. The circuit functions of the module can then be checked electrically before the entire assembly is packaged. The package may be finally sealed with a plymerizable compound to enhance its reliability.

Briefly, a high component density welded circuit package is formed according to one prior art assembly procedure by the components being jigged in position between two packaging guides (for example, Mylar films). Extremely close component relationships must be maintained. Accordingly, preselected hole locations and interconnection routing patterns are normally printed on the Mylar film. A small circular hole for receiving a component lead is then punched at each hole location. Components are inserted between the Mylar films such that the component lead wires pass through corresponding location holes. Each component is inserted between the two Mylar films by carefully separating the films and, from the side of the two adjacent films, sliding one component lead wire at a time into its respective location hole. The projecting leads are interconnected by welding conductors between them in accordance with the routing patterns printed on the Mylar sheets, and the necessary output terminals or connectors are welded into place. The assembly is carefully inspected, both visually and electrically, and finally encapsulated into a solid rectangular block.

One difficulty of this assembly operation is the frequent slippage of component leads from their holes in the Mylar film upon separation of the films as additional components are inserted. Considerable difficulty is also encountered in reworking the partially-assembled module after the positioning of the components between the films and their interconnection with conductors, if an electrical test shows one of the components to be defective. For example, if a defective component is located between the Mylar films near the center of the partially assembled module, normally each of the films must be cut and the conductors severed before the component is pulled from the partially-assembled module. Nevertheless, the frequent damage to circuitry during such a rework operation and the considerable amounts of time needed to perform module rework in this manner make such procedures prohibitive in mass assembly operations.

It is, therefore, an object of the present invention to simplify the assembly procedure of unitized welded circuit modules.

A further object of the present invention is to simplify the rework process on unitized welded circuit modules after their initial assembly.

It is yet another object of the present invention to provide apparatus for pre-cutting Mylar films so that components will easily pass therethrough and yet the films will support the components by their lead wires.

Another object of the present invention is to reduce the assembly time of welded circuit moduels.

Another object of the present invention is to provide welded circuit component packaging guides amenable to automated packaging techniques.

These and other objects are accomplished in accordance with features of the invention by a hole punch uniquely related to and adapted for cutting mutable holes in component packaging guides to enable components to be efficiently passed through one or the other of two packaging guides to a position therebetween. The mutable holes in the package guides are cut at the preselected hole locations and eliminate the necessity of further separating the package guides (Mylar films) in order to insert components therebetween. Additionally, the packaging guides having mutable holes therein simplify the rework process on a partially-assembled welded module by allowing the easy removal of components from positions between the packaging guides.

It should be noted that the use of the mutable holes in the Mylar film also provides a 65% saving in manufacturing time. This results because the components no longer need be inserted in such a manner that the films are being repeatedly pulled apart. Additionally, the mutable holes taught by the present invention tend to center the components as they are inserted.

In one embodiment of the invention, Mylar film is used as the packaging guide. The film has printed thereon the hole locations and the routing pattern. The Mylar films are prepunched with a star-shaped mutable hole at each hole location. The Mylar films are then positioned adjacent to one another so that the component bodies lie between the Mylar films and the lead wires of the components project through the films. The lead width are supported by the leaves of the star-shaped hole in generally-centered hole positions. Components are inserted between the Mylar films by pushing each through the star-shaped hole until its body is positioned between the films and its lead wires protrude on either side of the films. The leads may then, as before, be connected together by welding a conductor to the leads to form a desired electrical circuit. Should one of the components prove to be defective after testing the electrical circuit, it may be easily extracted through the Mylar film in the same manner as it was inserted.

In order to produce star-shaped mutable holes in the Mylar film, one embodiment of a star-shaped hole punch is described herein. The punch is generally cylindrical in form having a cylindrical hole punch coaxially mounted within a cylindrical holder. Extending outward from the hole punch are a number of blades radially oriented with respect to the hole punch and the cylindrical holder. The punch may be manually or machine operated to perforate the desired star-shaped holes at the preselected locations printed on the Mylar film.

These and other advantages and features which are believed to be characteristic of the present invention, both as to its organization and method of operation, will be better understood from the following description considered in connection with the accompanying drawings in which one embodiment of the present invention is illustrated by way of example. It is to be expressly understood, however, that the drawings are for the purpose of illustration and description only and are not intended as a definition of the limits of the invention.

Figure 1:
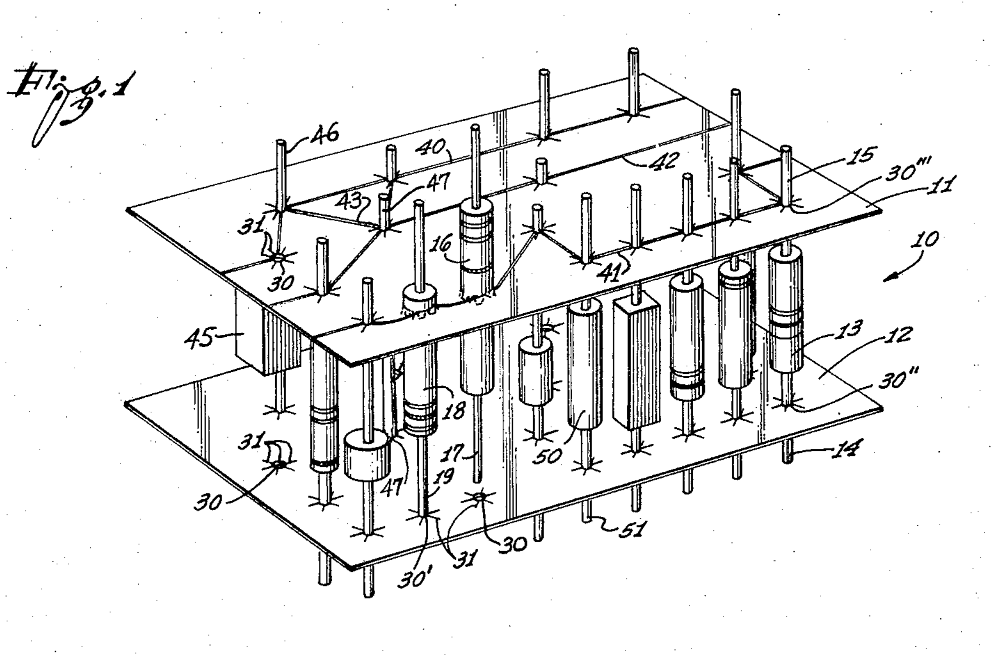
FIGURE 1 is an isometric view of a partially assembled welded-circuit module wherein electrical components are shown positioned between two component packaging guides constructed according to teachings of the present invention.

Attention is now directed to the drawings and, more particularly, to FIGURE 1 thereof, wherein corresponding parts of the invention will be designated by corresponding reference numerals. There is shown an electrical circuit module 10, in partially assembled form, comprising two pieces of insulating film 11 and 12, respectively, between which are supported a plurality of electrical components including components 13, 45 and 50. The insulating film may be of a number of materials such as Mylar, a tradename for a polyester film manufactured by the E. I. du Pont Company. On the Mylar films 11 and 12 are shown a number of generally star-shaped mutable holes each having a circular center section 30 and a plurality of relatively straight slits 31 radially extending therefrom. The radial slits 31 extending from the center section 30 form the star-shaped hole in the Mylar film.

The components illustrated in FIGURE 1 are inserted between the Mylar films 11 and 12 by pushing the components through the appropriate star-shaped hole in either the Mylar film 11 or the Mylar film 12. For example, a component 16 is illustrated in FIGURE 1 as being partially pushed through its respective star-shaped hole in the Mylar film 11. It may be seen that the length of the radial slits 31 is chosen to correspond with the maximum diameter of the components so that, as shown in FIGURE 1, the component 16 may be inserted through the star-shaped hole with very little effort.

The star-shaped holes in the Mylar films 11 and 12 also serve to reduce the time necessary for precisely centering the component lead wires in their respective hole locations. For example, a component lead wire 17 of the component 16 is illustrated as approaching the center section 30 of a star-shaped hole in the Mylar film 12. Adjacent to the component 16 is a component 18 inserted still further through the Mylar film 11 so that a lead wire 19 of the component 18 is tending to push through its appropriate star-shaped hole in the Mylar film 12. It will be noticed that the lead 19 has not been precisely aligned with a center section 30′ but has contacted the leaves of that hole formed by the slits 31. Nevertheless, because of the configuration of the star-shaped hole, the lead 19 will tend to be oriented within the center section 30′ of the star-shaped hole by the leaves of that hole.

A component 13, shown in FIGURE 1, has been properly positioned between the Mylar films 11 and 12. A component lead wire 14 of the component 13 is centered within the corresponding center section 30″, while a lead wire 15 of the component 13 is centered within the center section 30‴ of a star-shaped hole in the Mylar film 11. When all of the components are properly located between the Mylar films 11 and 12, as is the component 13, a conductor such as a nickel ribbon may be welded between the component lead wires to form the desired electrical circuit. In FIGURE 1 there is shown a routing pattern 41 that may be followed by the nickel ribbon to interconnect certain ones of the components including the component 13, the component 16 and the component 18. Additionally, there are shown three other routing patterns 40, 42 and 43 indicating the appropriate interconnection of other components positioned between the Mylar films 11 and 12.

It will be recognized by those skilled in the art that, in place of components, electrical conductors may be inserted between the Mylar films. For example, if a lead wire 51 of the component 50 is to be connected to a lead wire 46 of the component 45, an electrical conductor 47 may be inserted between the Mylar films 11 and 12, with each of the two ends thereof protruding through a star-shaped hole in one of the films. The conductor 47 is connected on the underside of the film 12 to the lead 51 and is connected on the upperside of the film 11 along the routing pattern 43 to the lead 46, thereby forming the proper electrical circuit.

Figures 2, 3:
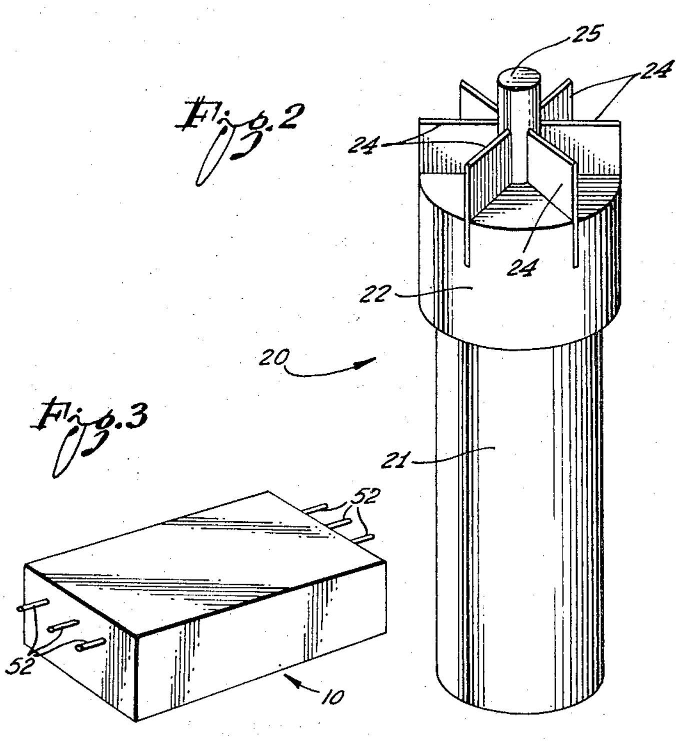
FIGURE 2 is a perspective drawing of one embodiment of a punching tool that may be used to mechanize the present invention.
FIGURE 3 is an isometric view of the circuit module illustrated in FIGURE 1 after the electrical components thereof have been fully encapsulated.

Referring to FIGURE 2 of the drawings, there is shown a punching tool 20 that may be employed to produce the star-shaped mutable holes in the Mylar films illustrated in FIGURE 1. The tool 20 is shown to include a cylinder 21 having coaxially attached thereto a cylindrical holder 22 having a diameter larger than the cylinder 21. Within the end of the holder 22 is inserted a cylindrical hole punch 25. The diameter of the hole punch 25 is chosen to be equal to the approximate diameter of the component lead wires to be inserted in the Mylar film. Radially extending from the hole punch 25 are a plurality of cutting blades 24 equally spaced circumaxially about the hole punch 25 and fixed in position by the holder 22. The length of the cutting blades 24 is determined by the length of the slots 31 to be cut in the Mylar film which, in turn, depend upon the diameter of the components to be inserted through the film. The component parts of the punch 25 may be made of a number of suitable materials, such as case-hardened steel.

It will be seen in FIGURE 2 that the cutting edges of the blade 24 are below the cutting surface of the hole punch 25. The tool has been mechanized in this fashion so that the center section 30 of the star-shaped hole is cut first, the Mylar film being held in position by the hole punch 25 while the blades 24 cut the desired number of radial slits 31 to form the star-shaped hole. It will be recognized by those skilled in the art, however, that the circular part of the star-shaped hole may be cut by a different tool than the tool used to make the radial slices extending therefrom. The tool illustrated in FIGURE 2 is merely one device that may be used to cut the center section 30 and the radial slits 31 of a star-shaped hole in one operation.

Accordingly, the assembly of a high-density welded module may be accomplished in accordance with the teachings of this invention in the following manner: On two Mylar films 11 and 12 are printed hole locations and an interconnection routing pattern. Employing a tool, such as the tool 20 illustrated in FIGURE 2, star-shaped holes are cut in the Mylar films at the hole locations. The Mylar films 11 and 12 are held in position by a jig. The components to be positioned therebetween are pushed through the star-shaped holes in one of the films (as the component 16, illustrated in FIGURE 1, is shown being pushed through a star-shaped hole) until the bodies of the components are between the Mylar films 11 and 12 and the component lead wires protrude through the center sections 30 of the star-shaped holes in the film. The electrical connections between the components are then made by welding a nickel ribbon to the component leads.

The partially-assembled module is tested. If one of the components in this partially-assembled module proves to be defective, the nickel ribbon is severed and the component pulled from its location in the module and a new component inserted through the Mylar film in its place. The nickel ribbon is again welded to the new component. Upon successful testing of the component assembly, the module finally would be either fully encapsulated (by placing the module in a cast and fully embedding the components in a solid mass of plastic or other insulating material to form a self supporting structure, as shown in FIGURE 3) or partially encapsulated (by partially dipping the welded module into the plastic or other insulating material to ruggedize and protect the electrical circuit the effects of adverse atmospheric conditions). As shown in FIGURE 3, one skilled in the art will recognize that the encapsulated module 10 is adopted to have a plurality of electrical terminals 52 extending outward therefrom and connected to various locations in the electrical circuit formed by the encapsulated components.

It is to be understood that the above-described arrangements are illustrative of the application of the principles of the invention. Numerous other arrangements may be devised by those skilled in the art without departing from the spirit and scope of the invention. Thus, by way of example and not of limitation, the packaging guides instead of being made of an insulating polyester film could be manufactured of paper or any other non-conductive material. On the other hand, it could be desired to have the packaging guides manufactured of a conductive material or film with mutable holes cut therein.

Figure 4:
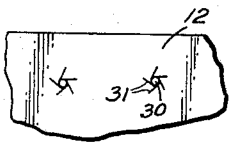
FIGURE 4 shows a modified method of forming mutable holes in the component packaging guides illustrated in FIGURE 1.

Additionally, the mutable holes may be formed in shapes other than that of a star. For example, the slits 31 may be crooked or may be tangentially oriented with respect to the circular center section 30 to form a mutable hole which is substantially pin-wheel shaped, as shown in FIGURE 4. Accordingly, from the foregoing, it is evident that various changes may be made without departing from the spirit and scope of the invention as defined in the appended claim.

What is claimed as new is:

An electrical circuit comprising:

a pair of component guides;

a first plurality of mutable holes cut in each of said component guides in a preselected pattern, said mutable holes including a central section and a predetermined number of slits extending outward from said central section, said component guides being positioned one above the other so that said plurality of mutable holes in one film align with said plurality of mutable holes in the other film;

a corresponding first plurality of electrical circuit elements including connecting leads, each of said circuit elements having a diameter equal to or less than the diameter of said mutable holes and at least one connecting lead of a diameter equal to or less than the diameter of said central section of said mutable hole, each of said circuit elements being positioned between said guides with its connecting leads protruding through corresponding ones of said mutable holes; and electrical conductors appropritely connecting each of said protruding connecting leads and welded thereto for producing the electrical circuit.

References Cited

UNITED STATES PATENTS

| | | | |
|---|---|---|---|
| 2,502,291 | 3/1950 | Taylor | 317—101 X |
| 3,151,277 | 9/1964 | Gray | 317—101 |

ROBERT K. SCAEFER, *Primary Examiner.*

W. C. GARVERT, J. R. SCOTT, *Assistant Examiners.*